United States Patent
Guthrie et al.

(10) Patent No.: US 6,653,798 B2
(45) Date of Patent: Nov. 25, 2003

(54) VOLTAGE DIMMABLE LED DISPLAY PRODUCING MULTIPLE COLORS

(75) Inventors: Don W. Guthrie, North Richland Hills, TX (US); Craig Jay Coley, Burleson, TX (US)

(73) Assignee: Aerospace Optics, Inc., Fort Worth, TX (US)

(*) Notice: Subject to any disclaimer, the term of this patent is extended or adjusted under 35 U.S.C. 154(b) by 80 days.

(21) Appl. No.: 09/949,139

(22) Filed: Sep. 7, 2001

(65) Prior Publication Data

US 2002/0047576 A1 Apr. 25, 2002

Related U.S. Application Data

(63) Continuation-in-part of application No. 09/675,752, filed on Sep. 29, 2000, now Pat. No. 6,323,598.

(51) Int. Cl.⁷ ................................................ H05B 37/00
(52) U.S. Cl. ................... 315/200 A; 315/291; 362/227; 362/231; 362/555; 323/282
(58) Field of Search ............ 315/169.1, 169.3, 315/164, 291, 200 A, 136, 185 R, 186; 362/800, 227, 231, 555, 561, 583; 323/267, 282; 250/552

(56) References Cited

U.S. PATENT DOCUMENTS

| | | | |
|---|---|---|---|
| 4,580,196 A | 4/1986 | Task | 362/62 |
| 4,939,426 A | 7/1990 | Menard et al. | 315/192 |
| 5,313,187 A | 5/1994 | Choi et al. | 340/331 |
| 5,608,290 A | 3/1997 | Hutchisson et al. | 315/200 A |
| 5,695,269 A | 12/1997 | Lippmann et al. | |
| 5,929,568 A | 7/1999 | Eggers | 315/56 |
| 5,939,839 A | 8/1999 | Robel et al. | 315/289 |
| 5,959,413 A | 9/1999 | Komarek et al. | 315/306 |
| 6,203,180 B1 | 3/2001 | Fleischmann | |
| 6,249,088 B1 * | 6/2001 | Chang | 315/185 R |
| 6,252,638 B1 * | 6/2001 | Johnson et al. | 349/5 |
| 6,288,497 B1 * | 9/2001 | Chang et al. | 315/185 R |
| 6,323,598 B1 | 11/2001 | Guthrie et al. | 315/200 A |
| 6,419,372 B1 * | 7/2002 | Shaw et al. | 362/231 |
| 2002/0047606 A1 | 4/2002 | Guthrie et al. | 315/224 |
| 2002/0048177 A1 | 4/2002 | Rahm et al. | 362/555 |

FOREIGN PATENT DOCUMENTS

| | | |
|---|---|---|
| DE | 298 09 774 U1 | 9/1998 |
| DE | 198 41 490 A1 | 3/2000 |
| EP | 0 695 112 A1 | 1/1996 |
| EP | 0 890 894 A1 | 1/1999 |
| EP | 0 991 304 A2 | 4/2000 |
| JP | 9-180584 | 7/1997 |
| JP | 9-301065 | 11/1997 |
| JP | 2000-323756 | 11/2000 |
| WO | WO 99/20085 | 4/1999 |

* cited by examiner

Primary Examiner—Haissa Philogene

(57) ABSTRACT

Multi-color illumination for a single display is achieved by utilizing an array of white light emitting diodes to produce illumination optically filtered by separate filters to produce the two or more desired output illumination colors at a desired luminance when the full rated voltage is applied to the light emitting diodes. Since all of the light emitting diodes have the same bandgap, voltage-controlled dimming produces uniform luminance changes for all colors as the voltage is reduced. A single voltage-controlled dimming driver circuit design and a single control voltage may therefore be utilized to achieve desired and uniform dimming characteristics independent of output illumination color.

33 Claims, 3 Drawing Sheets

VOLTAGE DIMMABLE LED DISPLAY PRODUCING MULTIPLE COLORS

CROSS-REFERENCE TO RELATED APPLICATIONS

This application is related to and claims priority as a continuation-in-part of U.S. patent application Ser. No. 09/675,752 now U.S. Pat. No. 6,323,598 entitled ENHANCED TRIM RESOLUTION VOLTAGE-CONTROLLED DIMMING LED DRIVER and filed Sep. 29, 2000. The content of the above-identified application is hereby incorporated by reference.

TECHNICAL FIELD OF THE INVENTION

The present invention is directed, in general, to voltage-controlled dimming illuminated displays and, more specifically, to voltage-controlled dimming of multi-color displays illuminated by light emitting diodes.

BACKGROUND OF THE INVENTION

Commercial and military aircraft crewstation instrumentation displays, like many other display systems, frequently employ illuminated indicators and controls. Traditionally, incandescent lamps operating at 5 VAC, 14 VDC or 28 VDC have been employed as illumination sources for illuminated pushbutton switches, indicators and annunciators within aircraft instrumentation. The illumination from such incandescent lamps is generally optically filtered to produce a wide range of human visible or night vision imaging system (NVIS) colors, including blue, green, yellow, red and white or the NVIS colors of NVIS blue, NVIS green A (blue-green), NVIS green B (green), NVIS yellow (yellow) and NVIS red (orange-red). In addition, the small size of incandescent lamps allows multiple lamps to be used within the same display to illuminate different regions of the display in different colors, providing, for example, four separate legends, each in a different color, on the same display for a single illuminated pushbutton switch, indicator or annunciator.

Color filters for incandescent displays usually comprise acrylic, polycarbonate, or glass materials, or some combination thereof. The filters are employed to adjust the basically Planckian spectral radiance of the incandescent lamps to meet the desired chromaticity coordinates and luminance levels at the maximum rated voltage(s) for the lamps. By combining multiple lamps and different color filters, displays can have multiple legends each lighting in different colors.

The filters employed for incandescent lamp displays also adjust the luminance of the display. The luminance of incandescent displays is approximately 400 foot-lamberts at full rated voltage for sunlight-readability in daytime flying. Such luminance levels are too bright for night flying, requiring the display luminance to be reduced for dark adaptations to prevent loss of visibility of outside imagery. The display luminance is typically reduced to 15 foot-lamberts for commercial/general aviation night flying, 1.0 foot-lambert for military night flying, and 0.1 foot-lamberts for night flying utilizing NVIS night vision goggles.

Because the luminance of incandescent lamps varies with applied voltage within a certain range, the voltage supplied to the displays is reduced to approximately one-half or less of the normal full rated operating voltage to reduce luminance levels for night flying conditions. Because all incandescent lamps have similar electrical and optical characteristics, each display and display color can maintain a luminance uniformity (of average luminance for different colors at a given voltage) of 4:1 or better as the voltage is reduced.

Unfortunately, however, the inherent characteristics of incandescent lamps lead to noticeable chromaticity shifts as the applied voltage is reduced. Moreover, incandescent lamps suffer other disadvantages when employed in aircraft instrumentation, including high power consumption, high inrush current, uncomfortably high touch temperatures, and unreliability in high vibration environments. As a result, considerable effort has been expended to incorporate more stable, efficient and reliable technologies, such as light emitting diodes (LEDs), into aircraft crewstation illuminated displays.

Light emitting diodes with narrow band spectral radiance are commercially available in a wide variety of colors suitable for aircraft crewstation illumination, including red, yellow, green and blue. Multiple light emitting diodes each emitting in a different color allow displays to have legends which light in different colors—that is, green legends illuminated by green light emitting diodes, yellow legends by yellow light emitting diodes, etc. Separate legends on a single display may light in different colors in this manner.

Using simple series resistance driver circuits tailored to the characteristics of the light emitting diodes, displays constructed for single color light emitting diodes are capable of producing sufficient luminance to be considered sunlight readable. While such displays function adequately at the maximum rated voltage for the particular light emitting diodes employed, problems arise when the applied voltage is reduced on the displays for night flying conditions. Due to differences in the bandgap voltage and voltage-luminance characteristics, different color light emitting diodes dim at different rates as the voltage is reduced to reduce the luminance of the display. As a result, light emitting diodes of one color extinguish before light emitting diodes of other colors have satisfactorily dimmed. Therefore, one colored legend on a particular display may become so dim as to be unreadable while an adjacent legend in a different color remains too bright for night flying.

The problems associated with voltage-controlled dimming of different color light emitting diodes arise from the inverse relationship of the bandgap voltage, and therefore the forward voltage drop, of a light emitting diode to the peak emission wavelength. For example, red light emitting diodes emitting at a wavelength of approximately 620–650 nanometers (nm) typically begin emitting at roughly 1.6 VDC, while yellow light emitting diodes emitting at a wavelength of about 570–590 nm begin emitting at approximately 1.8 VDC, green light emitting diodes emitting at a wavelength of about 520–540 nm begin emitting at approximately 2.2 VDC, and blue light emitting diodes emitting at a wavelength of about 470–480 nm begin emitting at approximately 2.5 VDC. Using voltage control techniques to reduce the luminance of multi-color displays, where each illumination color is provided by a different color light emitting diode, results in drastically different dimming for different color light emitting diodes. As the voltage is reduced, blue and green light emitting diodes tend to dim much faster than yellow and red light emitting diodes, often extinguishing before a voltage is reached which produces acceptable night flying luminance levels for the yellow and red light emitting diodes.

As a result, uniform luminance control of different color light emitting diodes has not been previously achieved with voltage dimming. Instead, dimming of displays using different color light emitting diodes has been through the use of pulse width modulation (PWM) or constant current drivers. The complexity of constant current circuitry and the high level of electromagnetic interference inherent to pulse width modulation have slowed integration of light emitting diodes into aircraft crewstation illumination.

There is, therefore, a need in the art for uniform voltage-controlled dimming of multi-color legends within a single display.

SUMMARY OF THE INVENTION

To address the above-discussed deficiencies of the prior art, it is a primary object of the present invention to provide, for use in aircraft crewstation displays, multi-color illumination for a single display, which in the present invention is achieved by utilizing an array of white light emitting diodes to produce illumination optically filtered by separate filters to produce the two or more desired output illumination colors at a desired luminance when the full rated voltage is applied to the light emitting diodes. Since all of the light emitting diodes have the same bandgap, voltage-controlled dimming produces uniform luminance changes for all colors as the voltage is reduced. A single voltage-controlled dimming driver circuit design and a single control voltage may therefore be utilized to achieve desired and uniform dimming characteristics independent of output illumination color.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIGS. 1A through 1F depict a perspective assembled view, a perspective exploded view, an exploded side view and front views of various components of a multi-color, voltage-controlled dimming, light emitting diode-illuminated display according to one embodiment of the present invention;

DETAILED DESCRIPTION OF THE INVENTION

FIGS. 1A–1F, 2 and 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1A:
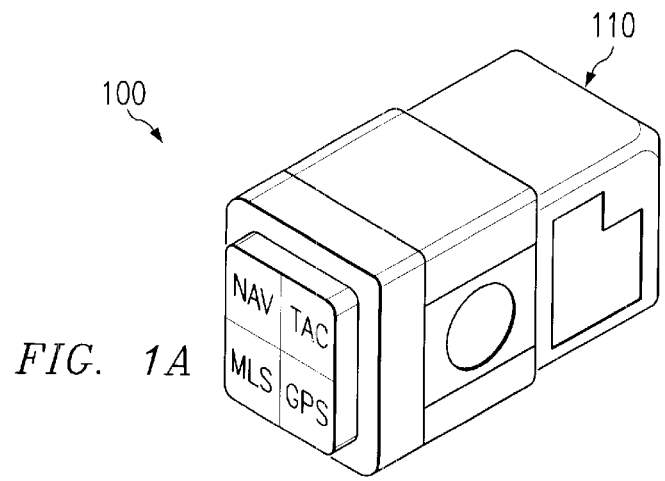
Figure 1B:
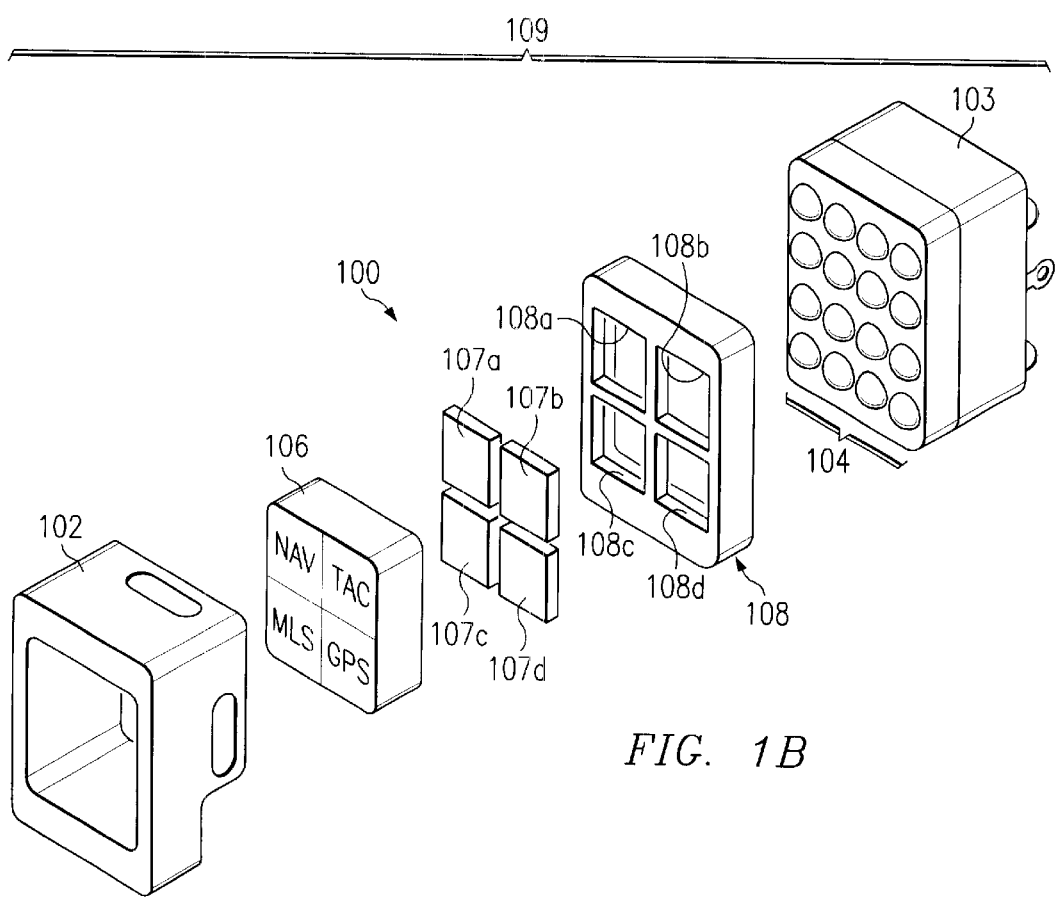

FIG. 1A depicts a perspective, assembled view of a multi-color, voltage-controlled dimming, light emitting diode-illuminated display according to one embodiment of the present invention. FIG. 1B depicts a perspective, exploded view of a portion of the same multi-color, voltage-controlled dimming, light emitting diode-illuminated display, and FIG. 1C depicts an exploded side view, of the same multi-color, voltage-controlled dimming, light emitting diode-illuminated display. The multi-color, voltage controlled dimming, light emitting diode illuminated display is implemented within an illuminated pushbutton switch in the exemplary embodiment, although skilled artisans will recognize that the present invention may be employed in conjunction with other types of illuminated displays, including but not limited to indicators and annunciators. Moreover, for simplicity the complete structure and operation of an illuminated pushbutton switch is not depicted or described herein. Instead, only so much of the structure and operation of a pushbutton switch as is unique to the present invention or necessary for an understanding of the present invention is depicted and described.

Illuminated pushbutton switch 100 includes a switch housing 101 receiving a switch cap 109 having a display surface 110 on which illuminated legends are visible, and which is pressed to actuate the switch. Pushbutton switch cap housing 102 receives an array of light emitting diodes 104 within a lamp mount 103, which also contains the driver circuits for voltage-controlled dimming of the light emitting diodes, with contacts 105 provided for making electrical connection to receive a voltage for driving the light emitting diodes.

As seen in FIGS. 1A–C, legend plate 106 in the exemplary embodiment contains four separate legends ("NAV", "TAC", "MLS" AND "GPS") to be visible on the display surface 110 in each of four quadrants, although two legends (each in one half) or three legends (one in one half and two each in one of the remaining two quadrants) may alternatively be employed. In any event, at least two of the legends to be visible on the display surface 110 are illuminated in different colors.

Figure 1D:
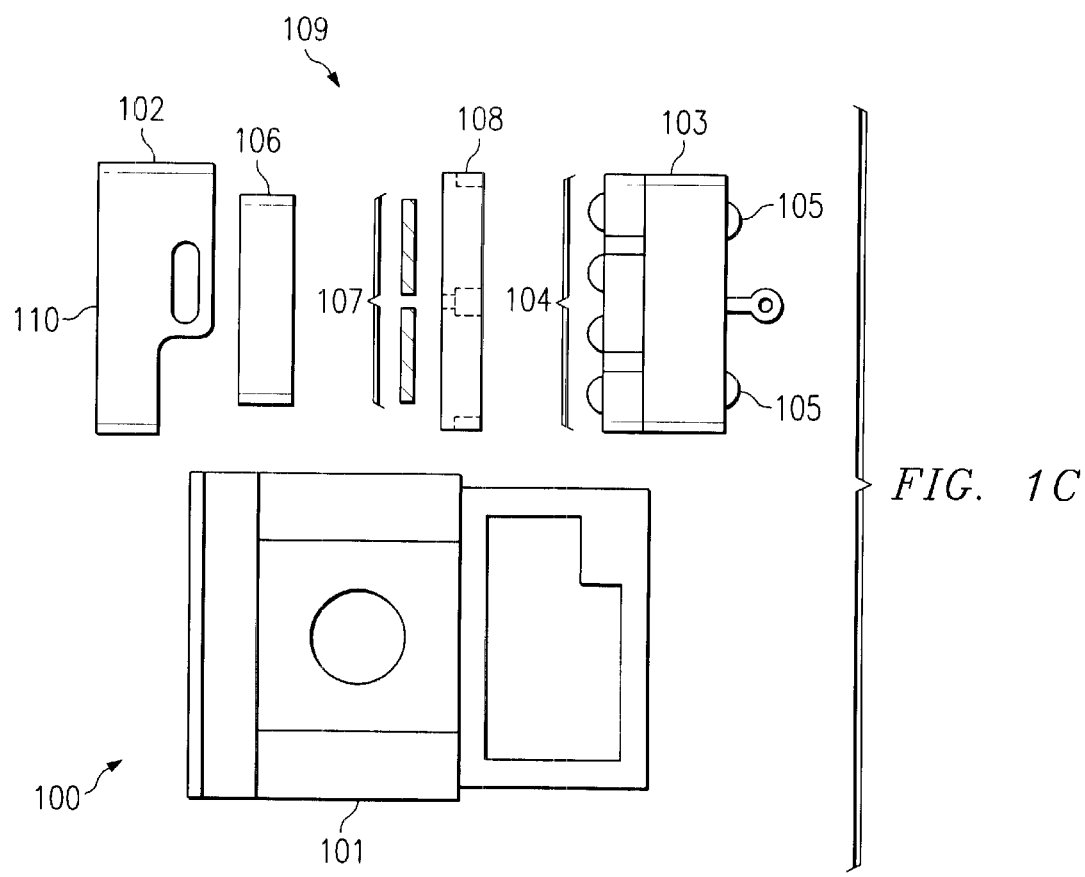
Figure 1D:
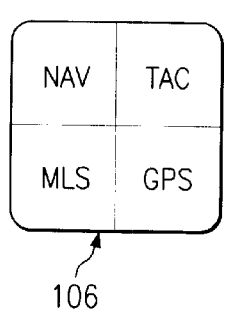
Figure 1E:
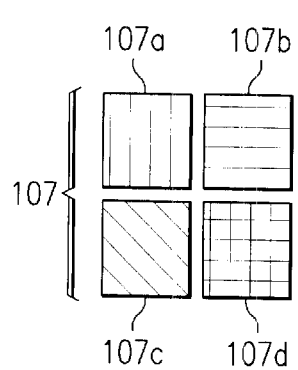
Figure 1F:
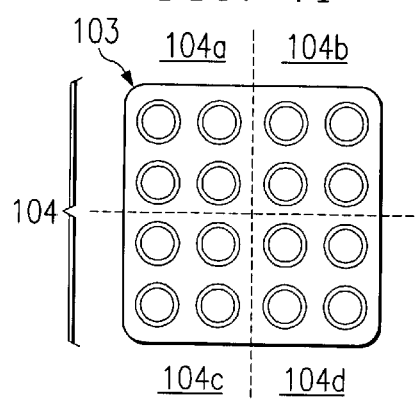

As seen in FIGS. 1B and 1F, the array 104 of light emitting diodes is, in the exemplary embodiment, a 4×4 array of sixteen light emitting diodes logically divided into quadrants 104a–104d. The light emitting diodes within each particular quadrant 104a–104d are driven as a group, so that all light emitting diodes within a quadrant 104a–104d are either on or off. Each quadrant 104a–104d employs a separate voltage-controlled dimming driver circuit as described in further detail below. Alternatively, however, the array 104 may instead be logically divided into two halves, or one half and two quadrants.

Although light emitting diodes within separate quadrants 104a–104d are independently switched to turn the light emitting diodes on or off, the same voltage is applied to all light emitting diodes within any quadrant 104a–104d which is switched on in order to provide uniform voltage-controlled dimming. Moreover, the driver circuits for each quadrant 104a–104d are identical and driven by the same control voltage to provide uniform voltage-controlled dimming.

To eliminate the bandgap problem described above and enable uniform voltage-controlled dimming of different color legends in illuminated pushbutton switch 100, each quadrant contains the same type of light emitting diode, having the same bandgap voltage (and voltage-luminance) characteristic. Light emitting diodes emitting a broad spectral radiance with a single bandgap have recently become commercially available. These light emitting diodes produce a narrow spectral radiance (typically blue) which is utilized to excite a broad spectral radiance fluorescence from a rare earth phosphor deposited within the light emitting diode package (i.e., "white" light emitting diodes). The combined spectral radiances of the light emitting diode and the phosphor emissions produce the appearance of a high color temperature white light source, with broad spectral radiance capable of producing a wide variety of colors including red, yellow, blue, green and white. In the present invention, each light emitting diode within array 104 is such a white light emitting diode.

Different colors of illumination are provided in the present invention through filters 107 disposed between light emitting diode array 104 and the legend plate 106, comprised of acrylic, polycarbonate, or glass materials, or a combination thereof. Filters 107 are selected to produce a specific chromaticity, as well as a desired luminance at one or more specific voltages. Through proper selection of filters 107, white light emitting diodes 104 may be employed to produce all colors desired.

Optical filters 107 contain colorants, dyes and/or pigments known in the art which selectively remove white light emitting diode spectral radiance to match specific chromaticity requirements for illuminated pushbutton switch 100 (e.g., red, yellow, white, green or blue). In addition, filters 107 may optionally also contain specialized dyes for absorption of non-visible red or near infra-red spectral emissions from the white light emitting diodes 104 for the purpose of producing night vision imaging system (NVIS) compatible red, yellow, blue or green colors. Also, filters 107 may be formed of glass or plastic with suitable thin-film optical (interference) coatings to remove the red or near-infrared spectral emissions. Therefore, white light emitting diodes 104 may be filtered to produce any lighted legend color, including the standard aircraft illumination colors of blue, green, yellow, red and white or the NVIS colors of NVIS blue, NVIS green A (blue-green), NVIS green B (green), NVIS yellow (yellow) and NVIS red (orange-red).

Filters 107 are also designed to control the output luminance emitting from the display surface 110 of pushbutton cap 109 so that colored lighting produced from the white light emitting diodes will have approximately the same luminance at a specific voltage, such as 400–500 foot-lamberts (sunlight readable) at the maximum or full rated operating voltage.

As illustrated by the different line patterns for filters 107a–107d in FIG. 1E, each filter 107a–107d within the pushbutton cap 109 may be selected to produce a different illumination color, so that adjacent legends are illuminated in different colors on legend plate 106. Since all of the light emitting diodes 104 are of the same type and have the same bandgap voltage characteristics and the same voltage-luminance characteristics, all illumination colors will dim uniformly when the control voltage (a single control voltage, independent of illumination color) applied to light emitting diodes 104 in each quadrant 104a–104d is decreased to reduce luminance. Multiple legends illuminated in at least two different colors on the pushbutton cap 109 for a single illuminated pushbutton switch 100 will therefore all dim uniformly as the applied voltage is reduced.

Filters 107 in the exemplary embodiment are held by filter mount 108, which has openings 180a–108d therethrough for each filter in the exemplary embodiment and essentially serves as a frame holding the four filters (or two or three filters for different arrangements of legends on display surface 110). When the illuminated pushbutton switch 100 depicted in FIGS. 1A–1F is assembled, the switch housing 101 will contain the pushbutton cap 109, including the pushbutton cap housing 102, the legend plate 106, filters 107, filter mount 108, and light emitting diode array 104, as well as the driver circuitry for each quadrant.

Figure 2:
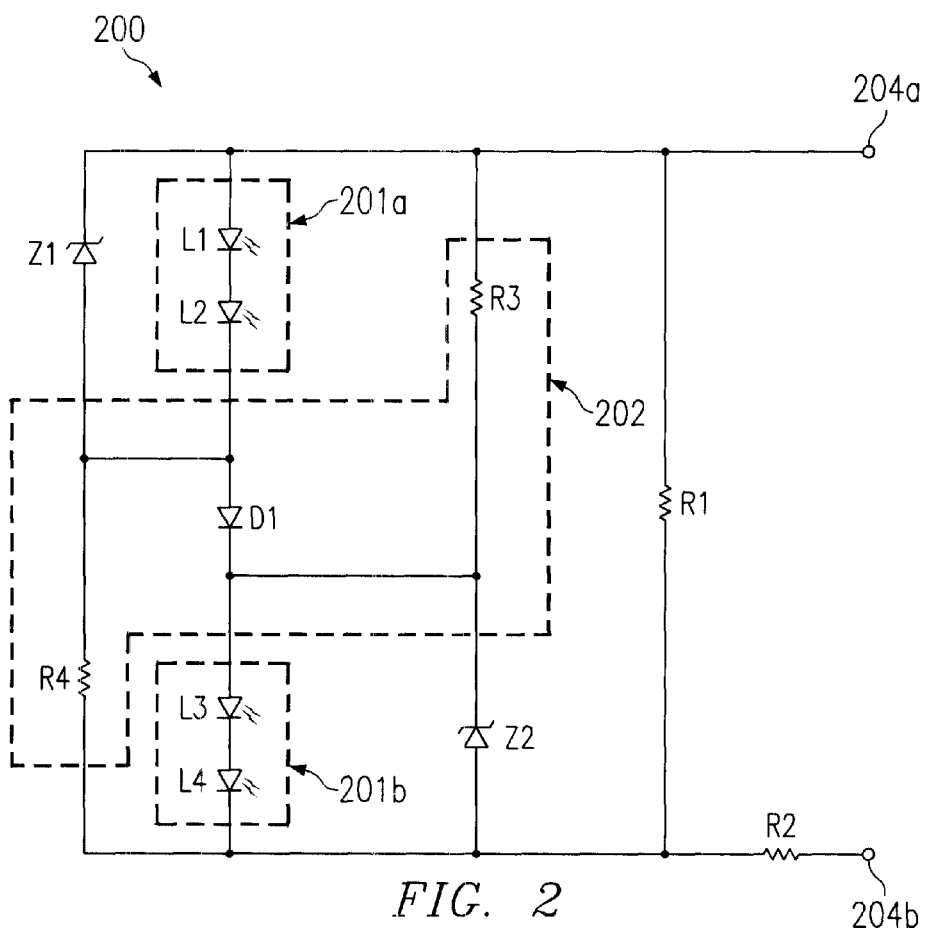
FIG. 2 is a circuit diagram for a voltage-controlled dimming light emitting diode driver employed within a multi-color, voltage-controlled dimming, light emitting diode-illuminated display according to one embodiment of the present invention.

FIG. 2 is a circuit diagram for a voltage-controlled dimming light emitting diode driver employed within a multi-color, voltage-controlled dimming, light emitting diode-illuminated display according to one embodiment of the present invention. In the exemplary embodiment, individual but identical driver circuits, each implemented by circuit 200, are separately employed for each quadrant 104a–104d of array 104.

Circuit 200 includes four white light emitting diodes L1–L4 from one of the quadrants 104a–104d, series-connected in pairs L1/L2 and L3/L4 within two LED groups 201a and 201b. A switching circuit 202 is connected between LED groups 201a and 201b to switch LED groups 201a and 201b from series-connection between input and output ports 204a and 204b to parallel-connection, or vice-versa, as the voltage applied across input and output ports 204a–204b is varied across a threshold or "kickover" value. Switching circuit 202 includes a switching diode D1 connected in series between LED groups 201a and 201b, a first resistor R3 connected in parallel with both LED group 201a and switching diode D1, and a second resistor R4 connected in parallel with both LED group 201b and switching diode D1.

The cathode of switching diode D1 is connected to the anode of the last light emitting diode L2 (in the direction of the forward voltage drop across the LEDs) within LED group 201a and to one end of resistor R4; the anode of switching diode D1 is connected to the cathode of the first light emitting diode L3 with LED group 201b and to one end of resistor R3. An opposite end of resistor R3 is connected to the cathode of the first light emitting diode L1 within LED group 201a, and an opposite end of resistor R4 is connected to the anode of the last light emitting diode L4 within LED group 201b.

LED groups 201a and 201b (comprising light emitting diode pairs L1/L2 and L3/L4) are connected by switching circuit 202 either in series or in parallel between input and output ports 204a–204b, depending on the voltage applied across the input and output ports 204a–204b. Switching circuit 202 provides kickover from parallel-connection to series-connection, and vice-versa, of LED groups 201a–201b. Switching diode D1 and resistors R3 and R4 enable the switching mechanism.

In operation, circuit 200 operates in two modes: high luminance mode above the kickover point, where the applied input voltage across ports 204a–204b is greater than the combined forward voltage drops (turn-on voltages) of light emitting diodes L1–L4 and switching diode D1; and low luminance mode below the kickover point, where the applied input voltage across ports 204a–204b is less than the combined forward voltage drops of light emitting diodes L1–L4 and switching diode D1 (but greater than the combined forward voltage drops of either of light emitting diode pairs l1/L2 or L3/L4).

In high luminance mode, switching diode D1 conducts, and most of the current between ports 204a–204b passes through the series connected path of light emitting diode pair L1/L2, switching diode D1, and light emitting diode L3/L4. The primary current path for high luminance control is established by the high luminance resistor R2.

In low luminance mode, switching diode D1 stops conducting and the current passes through the two parallel paths comprising: light emitting diode pair L1/L2 and resistor R4; and resistor R3 and light emitting diode pair L3/L4. Low luminance mode therefore results when the applied input voltage is insufficient to allow forward current to flow through switching diode D1. The primary current path for low luminance control is established by low luminance resistors R3–R4.

Resistor R1 provides a quiescent current path to prevent false or unintentional illumination at low current levels, which otherwise may produce detectable illumination at levels of as low as a few microamperes ($\mu A$). Resistor R1 is located to allow the rise in current across the resistor with applied voltage to halt at the combined forward voltage drops of light emitting diodes L1–L4 and switching diode D1, reducing unnecessary power dissipation at higher input voltages.

Zener diodes Z1 and Z2, in conjunction with high luminance resistor R2, provide circuit protection against transients, conducted electromagnetic susceptibility, or an electrostatic discharge event. Zener diodes Z1 and Z2 also prevent failure of the entire quadrant 104a–104d of display 100 should a single light emitting diode L1–L4 fail in an electrically open state, providing an alternate current path to maintain quadrant circuit integrity with two light emitting diodes still illuminating under such a catastrophic failure condition.

In addition to setting the kickover point as a function of input voltage applied across ports 204a–204b, resistor R2 serves to limit the current of a transient or overvoltage event and also serves to limit the operating current to safe levels in order to prevent a catastrophic failure of the display circuitry.

Because light emitting diodes 104 all having the same bandgap are utilized, multi-color display 100 may be dimmed using voltage-controlled dimming circuit 200 while maintaining the desired 4:1 luminance uniformity from sunlight readability to night flying luminance levels regardless of what illumination color is employed. Component values for voltage-controlled dimming circuit 200 are also independent of the output illumination color since only one bandgap and voltage-luminance characteristic need be considered. Uniform voltage-controlled dimming of multiple illumination colors utilizing a single control voltage is enabled for light emitting diode illumination sources. Standardized luminance levels are achieved from light emitting diode illumination sources at approximately the same voltages at which the desired luminance is achieved under industry standards which have evolved with respect to incandescent lamps (e.g., sunlight readable luminance of at least 300–500 foot-lamberts at the full rated voltage of 28 VDC, commercial night flying luminance of about 15–20 foot-lamberts at approximately 14 VDC, military night-flying luminance of about 1 foot-lambert at approximately 7 VDC, and NVIS-compatible luminance of about 0.1 foot-lamberts at approximately 6 VDC). However, improved reliability, energy efficiency and operating lifetimes for illuminated displays are achieved through use of light emitting diodes rather than incandescent lamps. Moreover, the voltage-dependent chromaticity shifts seen for incandescent lamps are not detectable with white light emitting diodes.

It should be noted that the design of FIG. 2 provides electrostatic discharge (ESD) protection for the light emitting diodes which is comparable to the inherent electrostatic discharge capabilities of incandescent lamps. Electrical transients within aircraft circuitry frequently spike up to 600 VDC, with up to a 100 ampere (A) peak current. While incandescent lamps are essential immune to those types of electrical transients encountered in aircraft circuitry, light emitting diodes are extremely susceptible to electrical transients, often failing when exposed to voltages of as low as 50 VDC. Circuit 200, however, provides electrical transient tolerance comparable to that exhibited by incandescent lamps while employing light emitting diodes instead.

Referring back to FIGS. 1A–1C, the four individual driver circuits for pushbutton switch 100, each implemented as shown in FIG. 2, are preferably formed on a flex circuit in accordance with the known art, which may then be folded and fit within pushbutton cap 109. The four drivers on the flex circuit are separate, without interconnection.

All components for implementing the present invention, including the four individual driver circuits for the four quadrants 104a–104d, fit within and are received and/or contained by pushbutton cap housing 102. Pushbutton cap 109 is preferably designed and sized to fit within a switch housing for a pushbutton switch employing incandescent lamp illumination, and operable with control elements within such an incandescent lamp-illuminated switch housing. No components necessary for the present invention are required to be located outside the pushbutton cap 109 (within, for example, switch housing 101). In this manner, existing illuminated displays with incandescent illumination may be retrofitted by replacement only of the pushbutton cap containing incandescent lamps with pushbutton cap 109 according to the present invention. The existing switch body need not be replaced to properly receive pushbutton cap 109 or to operate the illumination source within pushbutton cap 109. Retrofitting is accordingly simpler and less expensive than light emitting diode designs requiring components within the switch body or housing.

Figure 3:
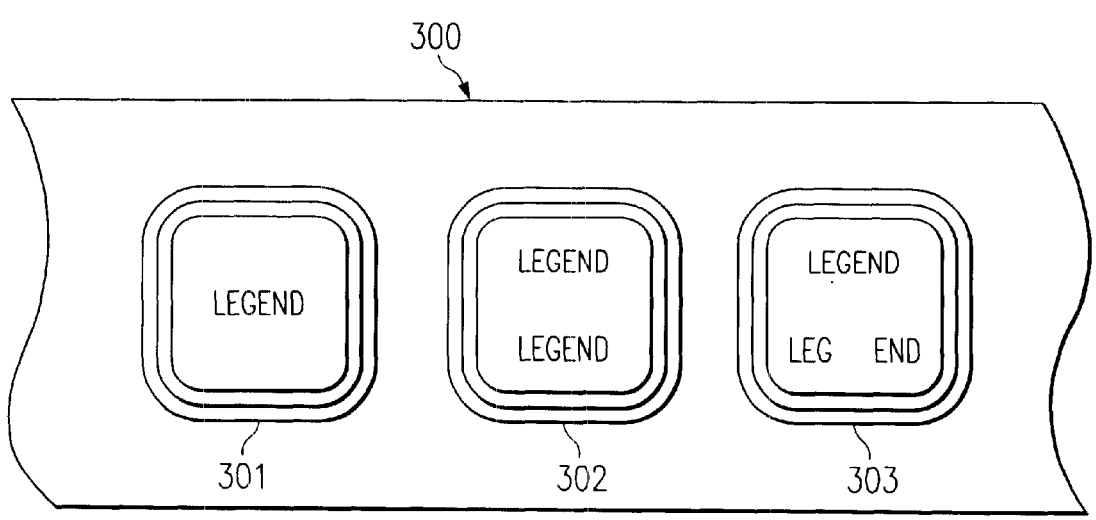
FIG. 3 illustrates a front view of an instrumentation panel including multiple voltage-controlled dimming, light emitting diode-illuminated displays in the form of multiple pushbutton switches, each illuminated in different colors, according to one embodiment of the present invention.

FIG. 3 illustrates a front view of an instrumentation panel including multiple voltage-controlled dimming, light emitting diode-illuminated displays in the form of multiple pushbutton switches, each illuminated in different colors, according to one embodiment of the present invention. The front view of three pushbutton switches 301–303 mounted within an instrumentation panel 300 is shown. Pushbutton switches 301–303 are similar, each implemented in the manner of pushbutton switch 100 depicted in FIGS. 1 and 2 and described above, and are all controlled (e.g., dimmed) by the same voltage.

In fact, pushbutton switches 301–303 are preferably identical except for the filters and the resulting legend colors. In the present invention, the different color display regions may be situated within different displays, such as in separate pushbutton switches controlled by the same voltage. With the present invention, however, different display regions will dim uniformly in response to changes to the common control voltage, whether the display regions are within a single switch, indicator or annunciator or within separate switches, indicators or annunciators.

Different configurations for the legend plate 106 are illustrated in FIG. 3, with, from left to right, a full-field display 301, a two-way split display 302 and a three-way split display 303 being shown. A four-way split display of the legend plate 106 is shown in FIG. 1D. Although the driver circuits 200 for each quadrant 104a–104b are separate, two or more driver circuits may be switched in unison (voltage-controlled dimming for different quadrants, when switched on, is already presumed to be uniform for all quadrants and all switches, indicators and annunciators) to concurrently illuminate one-half of the display area or the entire display area.

Legends on legend plate 106 may therefore be varied for different control configurations. A single, full-field legend, as shown for pushbutton switch 301, may be used where the driver circuits for all four quadrants are switched in unison. A two-way split of the display area, with two legends each occupying one half of the full field as shown for pushbutton switch 302, may be used where the driver circuits for all four quadrants are switched in predetermined pairs.

A three-way split of the display area, with one legend occupying one half of the display area and two other legends each occupying one of the remaining quarters of the display area as shown for pushbutton switch 303, may be used where driver circuits for two of the four quadrants are switched in unison while the remaining driver circuits are switched independently, both from each other and from the pair switched in unison. The four-way split of the display area shown in FIG. 1D may be employed where each of the driver circuits is switched independently from any of the others.

Obviously, a single optical filter is preferably employed for all corresponding quadrants when a multi-quadrant (i.e., full-field or half-field) legend is employed within a pushbutton switch, indicator, or annunciator, so that the entire full-field or half-field legend illuminates in the same color. Accordingly, filter mount 108 is configured to receive such half-field or full-field sized filters in such instances.

When less than a four-way split of the display area is employed for the legend plate 106, an additional level of fault-tolerance is introduced by the use of separate drivers for each quadrant. As noted above, each quadrant will continue to illuminate despite failure of one of the light emitting diodes (or both light emitting diodes within a series-connected group). Under such circumstances, the other series-connected group of light emitting diodes (not including the failed LED or LEDs) within the respective quadrant will continue to illuminate.

Where a full-field or half-field legend (and corresponding tandem switching of the two or more counterpart driver circuits) is employed, an entire quadrant may fail and the legend will continue to be at least partially illuminated, by the light emitting diodes within the remaining quadrant(s). Thus, multi-quadrant legends within either a full-field display 301, a two-way split display 302, or a three-way split display 303 exhibit a second level of fault tolerance beyond that provided for each quadrant.

Referring back to FIGS. 1B–1C and 1F, each white light emitting diode within the array 104 is preferably a diffused top light emitting diode. Such diffused top white light emitting diodes are commercially available. Use of diffused top light emitting diodes improves both the viewing angle (the maximum angle from the perpendicular to the display surface 110 at which the illuminated legend is still visible) and the luminance uniformity across the illuminated legend. Reflectors (not shown) may also be provided within pushbutton cap 109 to further improve the viewing angle.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. For use in an illuminated display, an illumination source for providing illumination of two or more desired colors comprising:
    two or more light emitting diodes driven by a single input voltage;
    a first filter through which illumination produced by one of the light emitting diodes is passed to produce output illumination of a first color within a first portion of the display; and
    a second filter through which illumination produced by another of the light emitting diodes is passed to produce output illumination of a second color within a second portion of the display,
    wherein a luminance of the output illumination of the first color is approximately equal to a luminance of the output illumination of the second color.

2. The illumination source as set forth in claim 1, wherein the luminance of the output illumination of the first color is approximately equal to the luminance of the output illumination of the second color for any input voltage across an operating range of input voltages.

3. The illumination source as set forth in claim 1, wherein the output illumination of the first color and the output illumination of the second color may be uniformly dimmed by reducing the input voltage.

4. The illumination source as set forth in claim 1, wherein the two or more light emitting diodes further comprise:
    an array of white light emitting diodes,
    wherein a first group of the white light emitting diodes within the array produces illumination passed through the first filter and a second group of the white light emitting diodes within the array produces illumination passed through the second filter.

5. The illumination source as set forth in claim 4, further comprising:
    a first driver circuit including the first group of the white light emitting diodes and receiving the input voltage; and
    a second driver circuit including the second group of white light emitting diodes and receiving the input voltage,
    wherein the first and second driver circuits are identical despite differences in the first and second output illumination colors.

6. The illumination source as set forth in claim 5, wherein the input voltage received by both the first and second driver circuits is selectively varied across an operating range of input voltages to alter the luminances of the first and second output illumination colors, and wherein the luminances of the first and second output illumination colors remain approximately equal despite changes in the input voltage.

7. The illumination source as set forth in claim 1, wherein the first and second filters each further comprise:
    acrylic, polycarbonate, glass, or a combination thereof containing one or more dyes in concentrations selected to produce a desired output illumination luminance in the first or second output illumination color from illumination produced by one of the light emitting diodes when a full rated voltage is applied as the input voltage.

8. The illumination source as set forth in claim 1, wherein the first and second portions of the display are display regions within a single illuminated switch, indicator or annunciator.

9. The illumination source as set forth in claim 1, wherein the first and second portions of the display are display regions within separate illuminated switches, indicators or annunciators.

10. For use in an illuminated display, a method of providing illumination of two or more desired colors comprising:
    driving two or more light emitting diodes with a single input voltage;
    directing illumination produced by one or the light emitting diodes through a first filter to produce output illumination of a first color within a first portion of the display; and
    directing illumination produced by another of the light emitting diodes through a second filter to produce output illumination of a second color within a second portion of the display,
    wherein a luminance of the output illumination of the first color is approximately equal to a luminance of the output illumination of the second color.

11. The method as set forth in claim 10, wherein the step of driving two or more light emitting diodes with a single input voltage further comprises:
    filtering the luminance produced by the two or more light emitting diodes through the first and second filters such that the luminance of the output illumination of the first color is approximately equal to the luminance of the output illumination of the second color for any input voltage across an operating range of input voltages.

12. The method as set forth in claim 10, further comprising:
    uniformly dimming the output illumination of the first color and the output illumination of the second color by reducing the applied input voltage.

13. The method as set forth in claim 10, wherein the step of driving two or more light emitting diodes with a single input voltage further comprises:
    driving an array of white light emitting diodes,
    wherein a first group of the white light emitting diodes within the array produces illumination passed through the first filter and a second group of the white light emitting diodes within the array produces illumination passed through the second filter.

14. The method as set forth in claim 13, wherein the step of driving an array of white light emitting diodes further comprises:
   driving the first group of white light emitting diodes using a first driver circuit receiving the input voltage; and
   driving the second group of white light emitting diodes using a second driver circuit receiving the input voltage,
   wherein the first and second driver circuits are identical despite differences in the first and second output illumination colors.

15. The method as set forth in claim 14, further comprising:
   selectively varying the input voltage received by both the first and second driver circuits across an operating range of input voltages to alter the luminances of the first and second output illumination colors, wherein the luminances of the first and second output illumination colors remain approximately equal despite changes in the input voltage.

16. The method as set forth in claim 10, wherein the steps of directing illumination produced by one of the light emitting diodes through a first filter to produce output illumination of a first color within a first portion of the display and directing illumination produced by another of the light emitting diodes through a second filter to produce output illumination of a second color within a second portion of the display each further comprise:
   directing illumination through a filter comprising acrylic, polycarbonate, glass, or a combination thereof containing one or more dyes in concentrations selected to produce a desired output illumination luminance in the first or second output illumination color from illumination produced by one of the light emitting diodes when a full rated voltage is applied as the input voltage.

17. A voltage-controlled dimming illuminated display comprising:
   first and second groups of white light emitting diodes selectively producing illumination for first and second display regions, respectively;
   first and second voltage-controlled dimming driver circuits driving the first and second groups of white light emitting diodes, respectively, in response to a single input voltage;
   a first optical filter between the first group of white light emitting diodes and the first display region filtering illumination produced by the first group of white light emitting diodes to produce output illumination of a first color on the first display region; and
   a second optical filter between the second group of white light emitting diodes and the second display region filtering illumination produced by the second group of white light emitting diodes to produce output illumination of a second color on the second display region,
   wherein a luminance of the output illumination of the first color is approximately equal to a luminance of the output illumination of the second color for any input voltage within an operating range of input voltages.

18. The voltage-controlled dimming illuminated display as set forth in claim 17, wherein the first and second voltage-controlled dimming driver circuits each further comprise:
   first and second sets of series-connected light emitting diodes connected between an input port and an output port; and
   a switching circuit coupled to the first and second sets of light emitting diodes, wherein the switching circuit switches the first and second sets of light emitting diodes between series-connection and parallel-connection.

19. The voltage-controlled dimming illuminated display as set forth in claim 18, wherein switching circuit within each of the first and second voltage-controlled dimming driver circuits further comprises:
   a diode connected in series between first and second sets of light emitting diodes, wherein the diode and all light emitting diodes within the first and second sets of light emitting diodes have a common forward bias orientation;
   a first resistor connected in parallel with the diode and the first set of light emitting diodes; and
   a second resistor connected in parallel with the diode and the second set of light emitting diodes.

20. The voltage-controlled dimming illuminated display as set forth in claim 17, wherein the output illumination of the first color and the output illumination of the second color may be uniformly dimmed by reducing the input voltage.

21. The voltage-controlled dimming illuminated display as set forth in claim 17, wherein the input voltage received by both the first and second driver circuits is selectively varied across an operating range of input voltages to alter the luminances of the first and second output illumination colors, and wherein the luminances of the first and second output illumination colors remain approximately equal despite changes in the input voltage.

22. The voltage-controlled dimming illuminated display as set forth in claim 17, wherein the first and second optical filters each further comprise:
   acrylic, polycarbonate, glass, or a combination thereof containing one or more dyes of types and in concentrations selected to produce a desired output illumination luminance in the first or second output illumination color from illumination produced by one of the first and second groups of white light emitting diodes when a full rated voltage is applied as the input voltage.

23. For use in an illuminated display, an illumination source for providing illumination of a desired color comprising:
   at least one white light emitting diode selectively driven by an input voltage; and
   an optical filter through which illumination produced by the white light emitting diode is passed to produce output illumination of the desired color,
   wherein a luminance of the output illumination varies in response to changes in the input voltage and equals one of two or more desired luminances, independent of the desired color, when the input voltage is a corresponding one of two or more predefined input voltages within an operating range of input voltages.

24. The illumination source as set forth in claim 23, wherein the optical filter further comprises:
   acrylic, polycarbonate, glass, or a combination thereof containing one or more dyes of types and in concentrations selected to produce a desired output illumination luminance in the desired color from illumination produced by at least one white light emitting diode when a full rated voltage is applied as the input voltage.

25. The illumination source as set forth in claim 23, wherein a driver for the at least one white light emitting diode contains component values selected independent of the desired color.

26. The illumination source as set forth in claim 23, wherein the at least one light emitting diode has a diffused top.

27. A pushbutton cap for retrofitting a pushbutton switch illuminated by incandescent lamps comprising:
   a mount holding an array of light emitting diodes;
   one or more drivers for selectively causing the light emitting diodes to illuminate in response to an input voltage; and
   one or more optical filters between the light emitting diodes and a display surface for producing illumination of at least one desired color at a preselected luminance corresponding to the input voltage,
   wherein the mount, the light emitting diodes, the drivers and the optical filters are all contained within a pushbutton cap which is capable of being received by a switch body for the pushbutton switch and, once disposed within the switch body, is operative with control elements within the switch body for operating the incandescent lamps.

28. The pushbutton cap as set forth in claim 27, wherein the drivers and the optical filters cause the illumination to have a luminance equivalent to a luminance of the incandescent lamps at the input voltage.

29. An illumination system for providing multiple levels of fault tolerance comprising:
   an illuminated display including first and second adjacent display regions spanned by a legend;
   a first illumination source including two or more light emitting diodes serially-connected at least when an input voltage exceeds a threshold and selectively illuminating the first display region; and
   a second illumination source including two or more light emitting diodes serially-connected at least when an input voltage exceeds a threshold and selectively illuminating the second display region,
   wherein, upon failure of one light emitting diode within one of the first or second illumination sources, one or more remaining light emitting diodes within the respective first or second illumination source continues to illuminate the corresponding first or second display region.

30. The illumination system as set forth in claim 29, wherein the first and second illumination sources operate independently, each continuing to illuminate the corresponding first or second display region after failure of a light emitting diode within the other of the first or second illumination sources.

31. The illumination system as set forth in claim 30, wherein the legend also spans third and fourth display regions illuminated by third and fourth illumination sources, respectively.

32. An illumination system for providing flexibility in configuring an illuminated display comprising:
   an array of light emitting diodes logically divided into quadrants, each quadrant illuminating a portion of a display; and
   four separate drivers independently controlling operation of light emitting diodes within each quadrant,
   wherein all drivers are controlled individually to provide a four-way split illuminated display, and
   wherein two or more drivers are selectively controlled in unison to provide a full field illuminated display, a two-way split illuminated display, or a three-way split illuminated display.

33. The illumination system as set forth in claim 29, wherein the four separate drivers produce uniform voltage-controlled dimming by all quadrants.

* * * * *